United States Patent
Yan

(10) Patent No.: US 12,353,254 B2
(45) Date of Patent: Jul. 8, 2025

(54) ROTATING SHAFT MECHANISM AND ELECTRONIC DEVICE

(71) Applicant: Honor Device Co., Ltd., Shenzhen (CN)

(72) Inventor: Bin Yan, Shenzhen (CN)

(73) Assignee: HONOR DEVICE CO., LTD., Shenzhen (CN)

(*) Notice: Subject to any disclaimer, the term of this patent is extended or adjusted under 35 U.S.C. 154(b) by 0 days.

(21) Appl. No.: 18/004,001

(22) PCT Filed: Sep. 6, 2022

(86) PCT No.: PCT/CN2022/117343
§ 371 (c)(1),
(2) Date: Apr. 6, 2023

(87) PCT Pub. No.: WO2023/051198
PCT Pub. Date: Apr. 6, 2023

(65) Prior Publication Data
US 2024/0084844 A1    Mar. 14, 2024

(30) Foreign Application Priority Data
Sep. 30, 2021   (CN) .................... 202122409432.6

(51) Int. Cl.
*G06F 1/16*        (2006.01)
*H05K 5/02*        (2006.01)

(52) U.S. Cl.
CPC ......... *G06F 1/1681* (2013.01); *H05K 5/0226* (2013.01)

(58) Field of Classification Search
None
See application file for complete search history.

(56) References Cited

U.S. PATENT DOCUMENTS

| 2020/0323091 A1* | 10/2020 | Nagai | H04M 1/0268 |
| 2021/0014989 A1* | 1/2021 | Hsu | E05D 7/00 |
| 2021/0267076 A1* | 8/2021 | Zhang | H05K 5/0226 |

FOREIGN PATENT DOCUMENTS

| CN | 110056569 A | 7/2019 |
| CN | 110552953 A | 12/2019 |
| CN | 110778600 A | 2/2020 |
| CN | 216447292 U | 5/2022 |

* cited by examiner

*Primary Examiner* — Anthony Q Edwards
*Assistant Examiner* — Rashen E Morrison
(74) *Attorney, Agent, or Firm* — Conley Rose, P.C.

(57) ABSTRACT

A rotating shaft mechanism includes a shaft cover and first rotating arms disposed on both sides of the shaft cover. A second rotating arm is disposed between the first rotating arm and the shaft cover, and the first rotating arm is slidably connected to the second rotating arm, such that the first rotating arm and the shaft cover form a rotational connection. The second rotating arm includes a connection portion and a slider. The slider separately has a second distance and a third distance from two end faces of the connection portion in a direction of the rotating shaft. The first rotating arm includes a chute, and the chute is slidably connected to the slider, such that the chute overlaps the second rotating arm. The chute extends for a fourth distance in a direction close to the rotating shaft.

20 Claims, 14 Drawing Sheets

ROTATING SHAFT MECHANISM AND ELECTRONIC DEVICE

CROSS-REFERENCE TO RELATED APPLICATIONS

This application is a U.S. National Stage of International Application No. PCT/CN2022/117343 filed on Sep. 6, 2022, which_claims priority to Chinese Patent Application No. 202122409432.6, filed with the China National Intellectual Property Administration on Sep. 30, 2021, both of which are incorporated herein by reference in their entireties.

TECHNICAL FIELD

This application relates to the field of terminal technologies, and in particular, to a rotating shaft mechanism and an electronic device.

BACKGROUND

A foldable screen device replaces a screen of a conventional electronic device with a flexible screen that can implement screen bending and folding, to implement folding of the electronic device. The foldable screen device is usually provided with a rotating shaft mechanism, two parts of the body that are disposed on both sides of the rotating shaft mechanism and rotatable around the rotating shaft mechanism, and a flexible screen that covers a surface of the two parts of the body and is fastened to a middle frame of the body.

During design of a rotating shaft mechanism of a foldable mobile phone, to ensure that a screen length is almost unchanged in folding and unfolding processes of the foldable screen device, a chute and a slider are usually disposed in the rotating shaft mechanism to limit relative movement of the rotating shaft mechanism and the body, so that in a flattening process of the foldable screen device, an overlapping length of the chute and the slider increases, the rotating shaft mechanism and the body come close to each other, and the flexible screen fastened in the middle frame of the body gradually flattens, and the overlapping length of the chute and the slider is maximum when the flexible screen totally flattens; and in a folding process of the foldable screen device, the overlapping length of the chute and the slider decreases, the rotating shaft mechanism and the body move far away from each other, the flexible screen that is fastened in the middle frame in the body gradually folds, and the overlapping length of the chute and the slider is minimum when the flexible screen fully folds. To ensure that there is still a strong stability constraint after folding, a minimum overlapping length between a slider and a chute required, which is usually greater than a design threshold, for example, 3 mm.

However, in a rotating shaft mechanism of an existing foldable mobile phone, there is an unused gap between a shaft cover, a slider, and a chute of the rotating shaft mechanism. Therefore, an unfolded width of the rotating shaft mechanism is too large while a requirement for a minimum overlapping length between the slider and the chute is met.

SUMMARY

This application provides a rotating shaft mechanism and an electronic device, so as to resolve a problem that an unfolded width of the rotating shaft mechanism is too large while a requirement for a minimum overlapping length between a slider and a chute is met.

According to a first aspect, an embodiment of this application provides a rotating shaft mechanism, including: a shaft cover and first rotating components disposed on both sides of the shaft cover. A second rotating component is disposed between the first rotating component and the shaft cover, the first rotating component is slidably connected to the second rotating component, and the second rotating component is configured to rotate relative to the shaft cover, so that the first rotating component and the shaft cover form a rotational connection. The shaft cover includes a side wall facing the first rotating component, a rotating shaft of the second rotating component is located on an inner side of the side \van, and the inner side of the side wall is a side facing away from the second rotating component. The second rotating component includes a connection portion and a slider, and the connection portion includes a first end located between the first rotating component and the side wall; one end of the slider is connected to a first end of the connection portion, and the other end extends for a first distance in a direction away from the side wall; and the slider separately has a second distance and a third distance from two end faces of the connection portion along a direction of the rotating shaft. The first rotating component includes a chute, and the chute is slidably connected to the slider, so that the chute overlaps the second rotating component; and the chute extends for a fourth distance in a direction close to the rotating shaft, and when the rotating shaft mechanism is being unfolded, an end that is of the chute and that is close to the rotation shaft extends beyond the first end, to increase an overlapping length between the chute and the second rotating component.

In this way, with the second distance and the third distance separately provided between the slider and the two end faces of the connection portion in the direction of the rotating shaft, and the chute that extends the first rotating part, when the rotating shaft mechanism is unfolded, the connection portion may enter the chute, and the end that is of the chute and that is close to the rotating shaft extends beyond the first end. Therefore, when the rotating shaft mechanism is folded, an overlapping length between the chute and the second rotating part is increased. Therefore, an unfolding width of the rotating shaft mechanism can be narrowed while a requirement for a minimum overlapping length between the slider and the chute is met.

In an embodiment, an opening matching a position of the connection portion in the direction of the rotating shaft is disposed on an end face of that is of the chute and that is close to the connection portion, a width of the opening in the direction of the rotating shaft is greater than or equal to a width of the connection portion in the direction of the rotating shaft, and the width of the opening in the direction of the rotating shaft is less than a width of the chute in the direction of the rotating shaft. In this way, the connection portion does not interfere with the extended part of the chute.

In an embodiment, the opening runs through the first rotating component in a direction perpendicular to the rotating shaft.

In an embodiment, the second rotating part further includes a rotating portion. The connection portion further includes a second end located on an inner side of the side wall. The rotating portion is connected to the second end of the connection portion, the rotating portion rotates relative to the shaft cover, and the rotating portion can rotate around the rotating shaft.

In an embodiment, the connection portion includes a first connecting piece and a second connecting piece, and there is an included angle between the first connecting piece and the second connecting piece to form an L-shaped structure. One end of the first connecting piece is the second end, and is connected to the rotating portion. The other end of the first connecting piece extends along a direction in which the rotating portion is away from the rotating shaft, and is connected to one end of the second connecting piece; and the other end of the second connecting piece is the first end, and is connected to the slider.

In an embodiment, a width of the first connecting piece is greater than a width of the second connecting piece. The second connecting piece is disposed between two end faces of the first connecting piece in the direction of the rotating shaft. The second connecting piece, the slider, and the first connecting piece separately form a first groove and a second groove on both ends of the slider.

In an embodiment, the second rotating component further includes a protruding portion. One end of the protruding portion is connected to the first end of the connection portion, the other end extends for a certain distance in a direction close to the side wall, and the slider and the protruding portion are located in a same plane. In this way, the protruding portion that is located in a same plane as the slider and has an opposite extension direction is added to the second rotating component, so that when the chute slides in a direction close to the side wall, in addition to forming the slidable connection to the slider, the chute further forms a slidable connection to the protruding portion, thereby increasing an overlapping length between the chute and the second rotating component. The shaft cover includes the side wall facing the first rotating component. When the chute slides in a direction close to the side wall, the side wall can provide more space for extension for the protruding portion than a side wall of another shape (for example, a square side wall). In addition, this structure can make one end of the chute of the first rotating component closer to the side wall while the first rotating component does not interfere with the shaft cover, so that the overlapping length between the chute and the second rotating component increases. Therefore, the rotating shaft mechanism provided in this embodiment of this application may narrow a length of the first rotating component by reducing the overlapping length between the slider and the chute while a requirement for a minimum overlapping length between the slider and the chute is met, thereby narrowing an unfolding width of the rotating shaft mechanism.

In an embodiment, the second rotating component includes two protruding portions, and the two protruding portions are distributed at both ends of the slider in the direction of the rotating shaft.

In an embodiment, the second rotating component further includes a connecting piece. One end of the connecting piece is connected to the first end of the connection portion, the other end extends for a certain distance in a direction close to the side wall, and the connecting piece and the protruding portion are in a same plane. End faces of the connecting piece in the direction of the rotating shaft are separately connected to the two protruding portions.

In an embodiment, the shaft cover includes a support wall structure; the support wall structure has a U-shaped cross-section in a direction perpendicular to the rotation axis, and extends for a certain distance along a direction parallel to the rotating shaft to form a U-shaped wall surface; and the U-shaped wall surface forms two side walls on both sides of an axis of the shaft cover. In this way, in addition to providing more space for the protruding portion and the chute, the side wall also helps the second rotating component avoid interference with the shaft cover as much as possible when the second rotating component is rotating relative to the shaft cover.

In an embodiment, a first arc surface matching a size and a shape of the side wall is disposed on an end that is of the first rotating component and that is close to the rotating shaft.

According to a second aspect, an embodiment of this application provides an electronic device, including the foregoing rotating shaft mechanism, middle frame, and flexible screen. The first rotating component in the rotating shaft mechanism is connected to the middle frame, and the middle frame is connected to the flexible screen, to implement rotation of the middle frame and the flexible screen with rotation of the rotating shaft mechanism. According to the rotating shaft mechanism provided in this embodiment of this application, an unfolding width of the rotating shaft mechanism can be narrowed, so that a width of the electronic device can be narrowed, thereby ensuring maximum space utilization of the entire device.

Figure 4A:
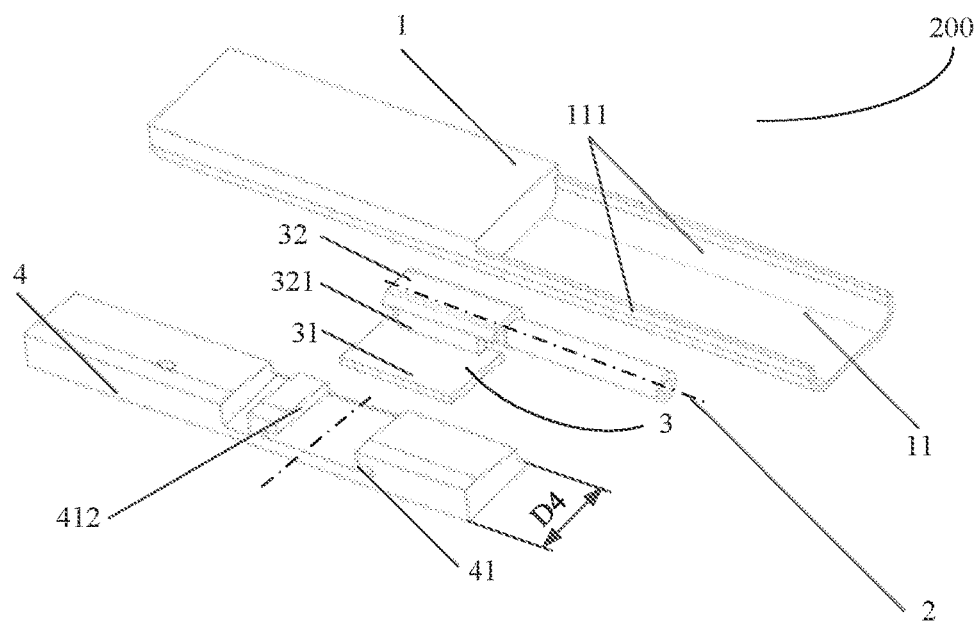
Figure 4B:
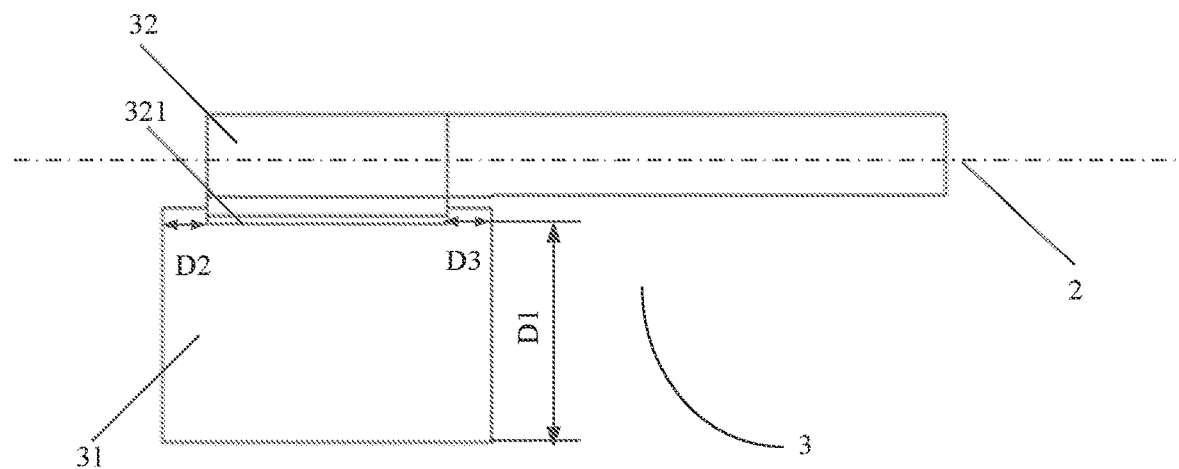
Figure 5A:
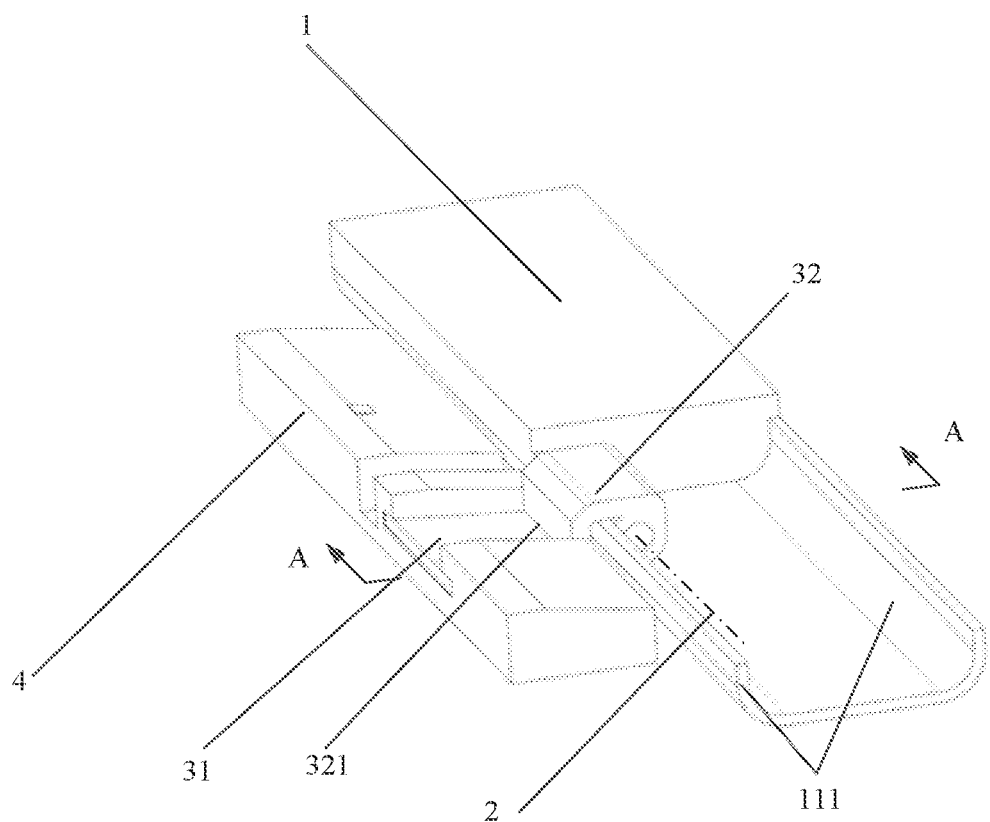
Figure 5B:
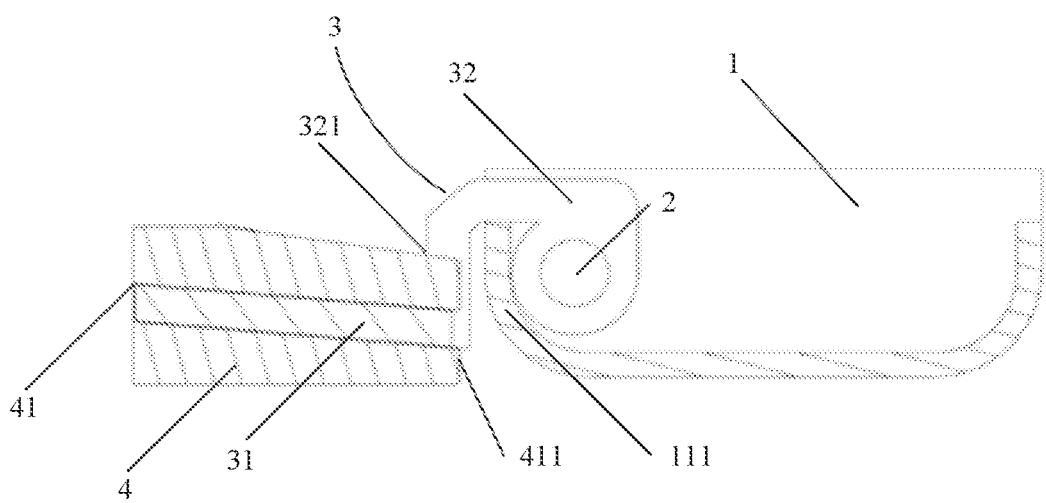
Figure 6A:
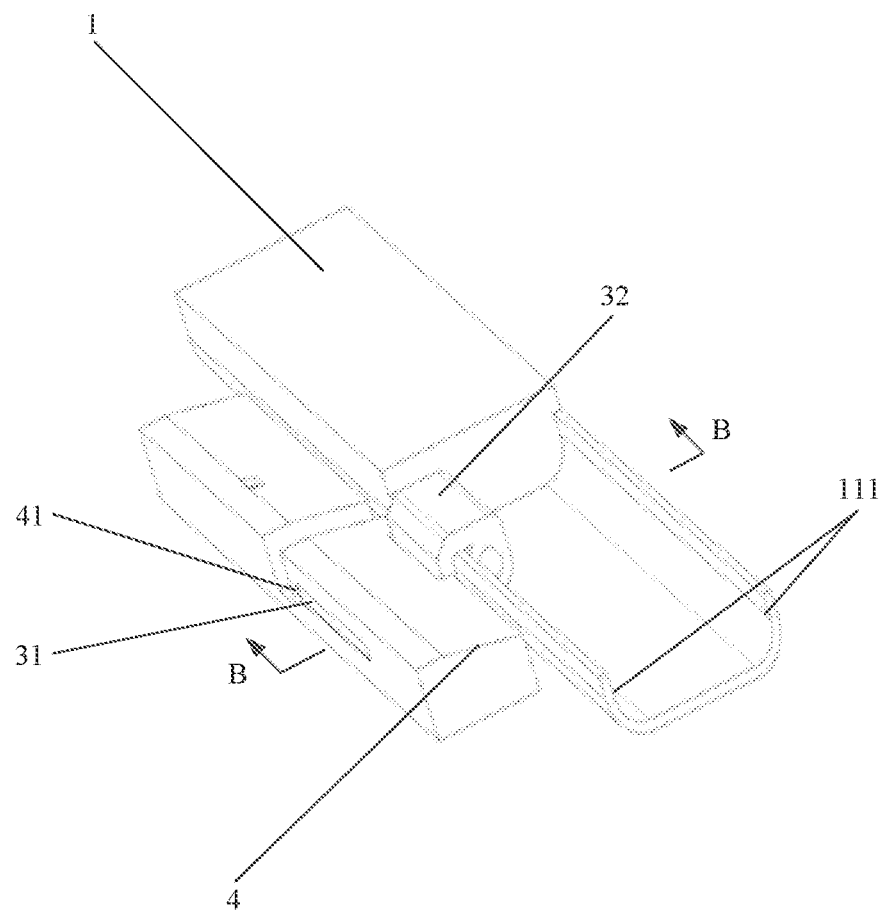
Figure 6B:
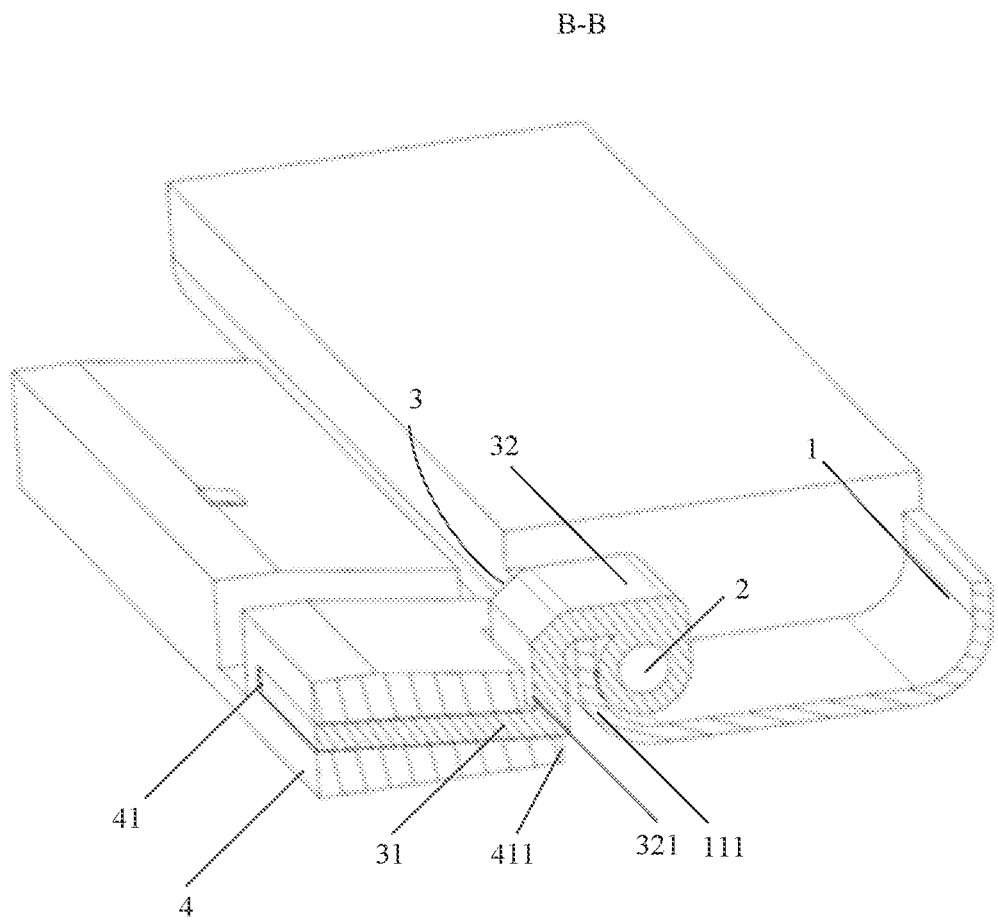
Figure 6C:
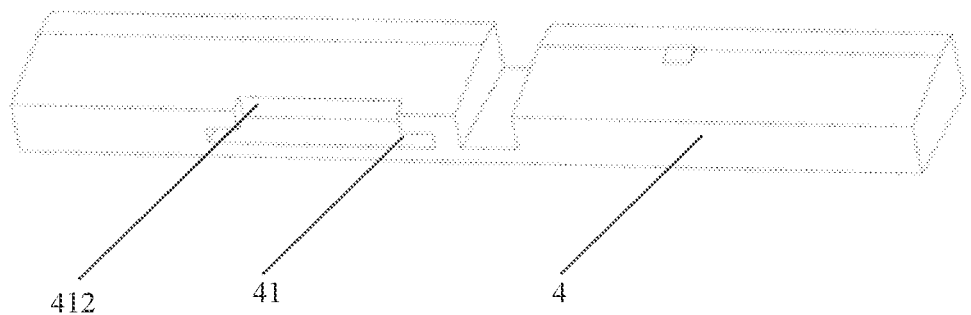
Figure 7A:
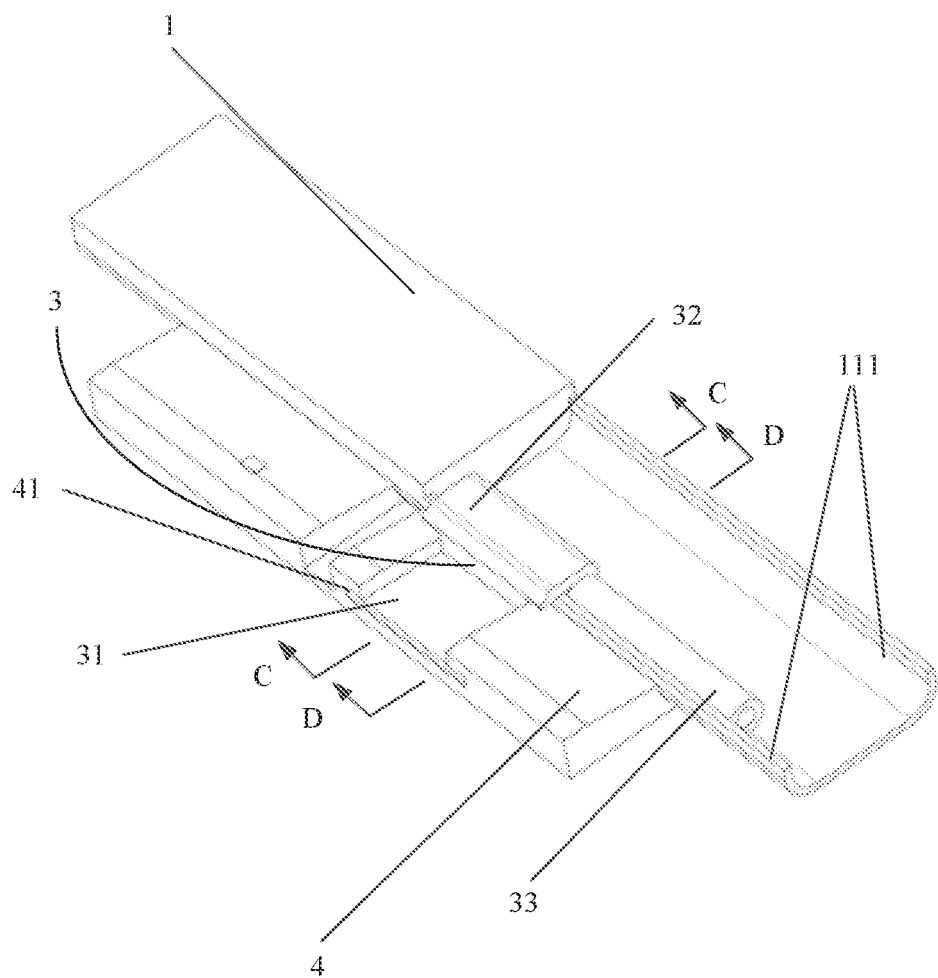
Figure 7B:
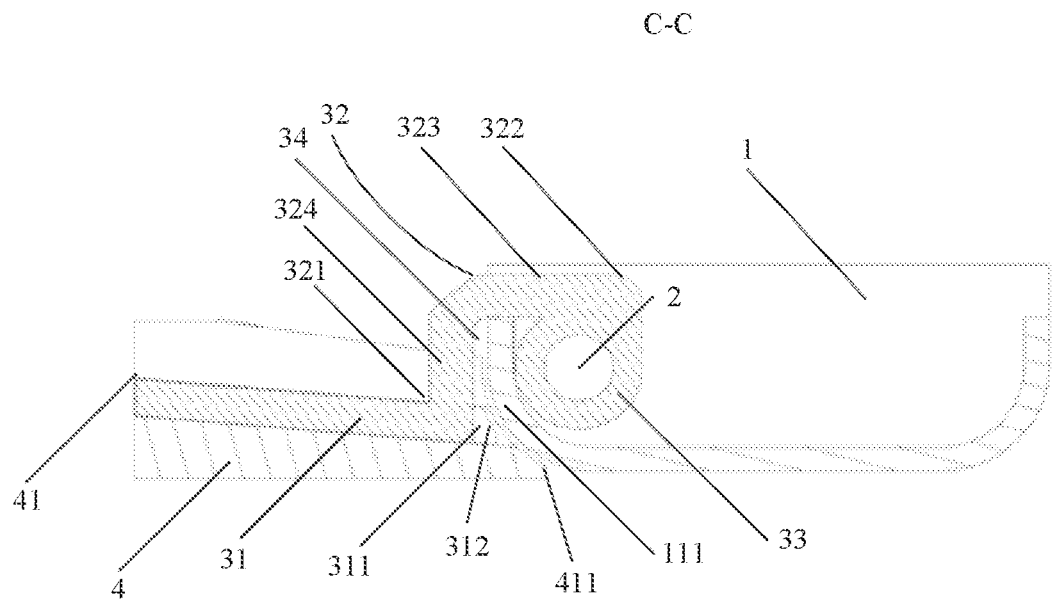
Figure 7C:
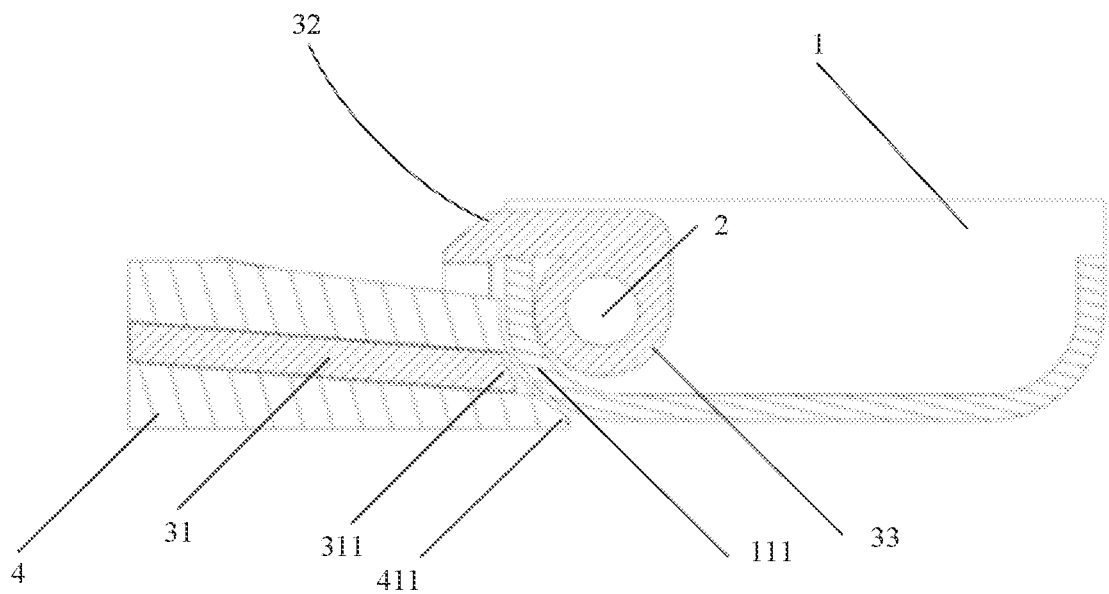
Figure 8A:
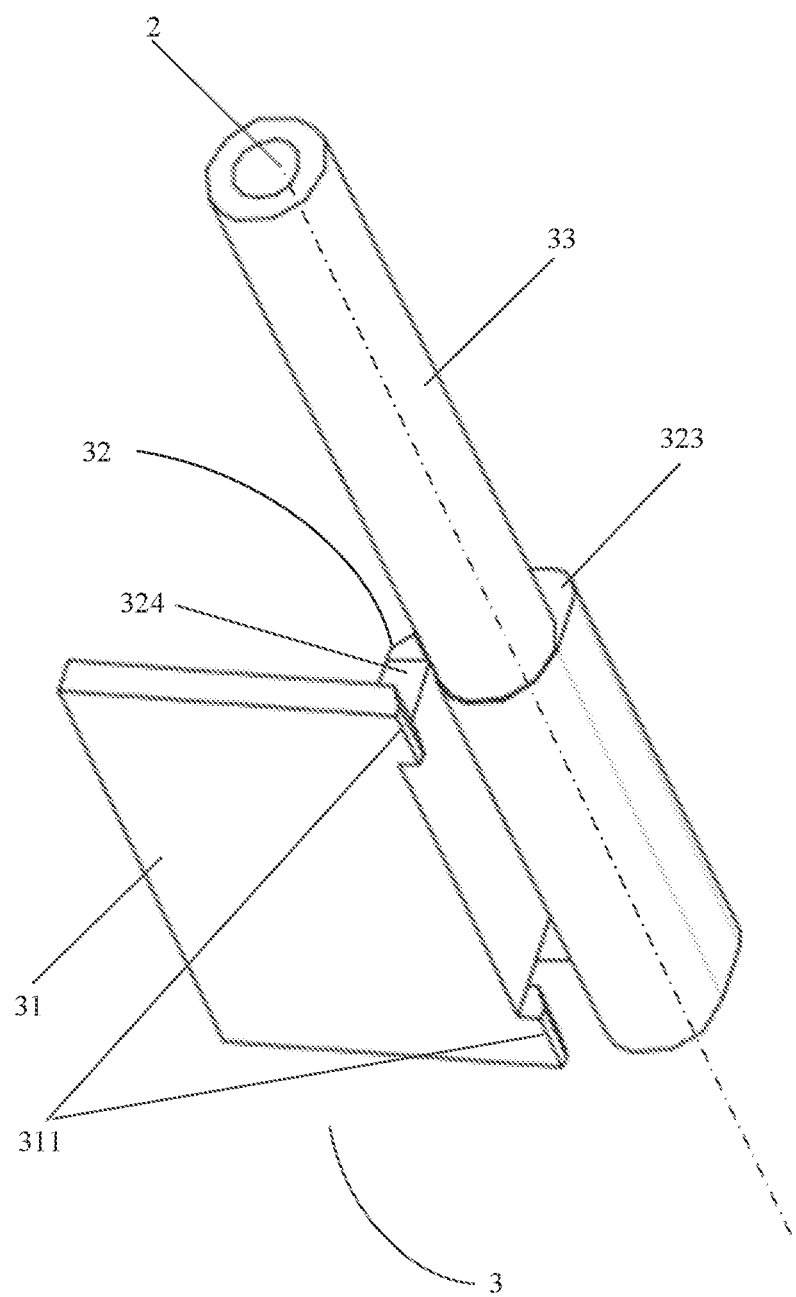
Figure 8B:
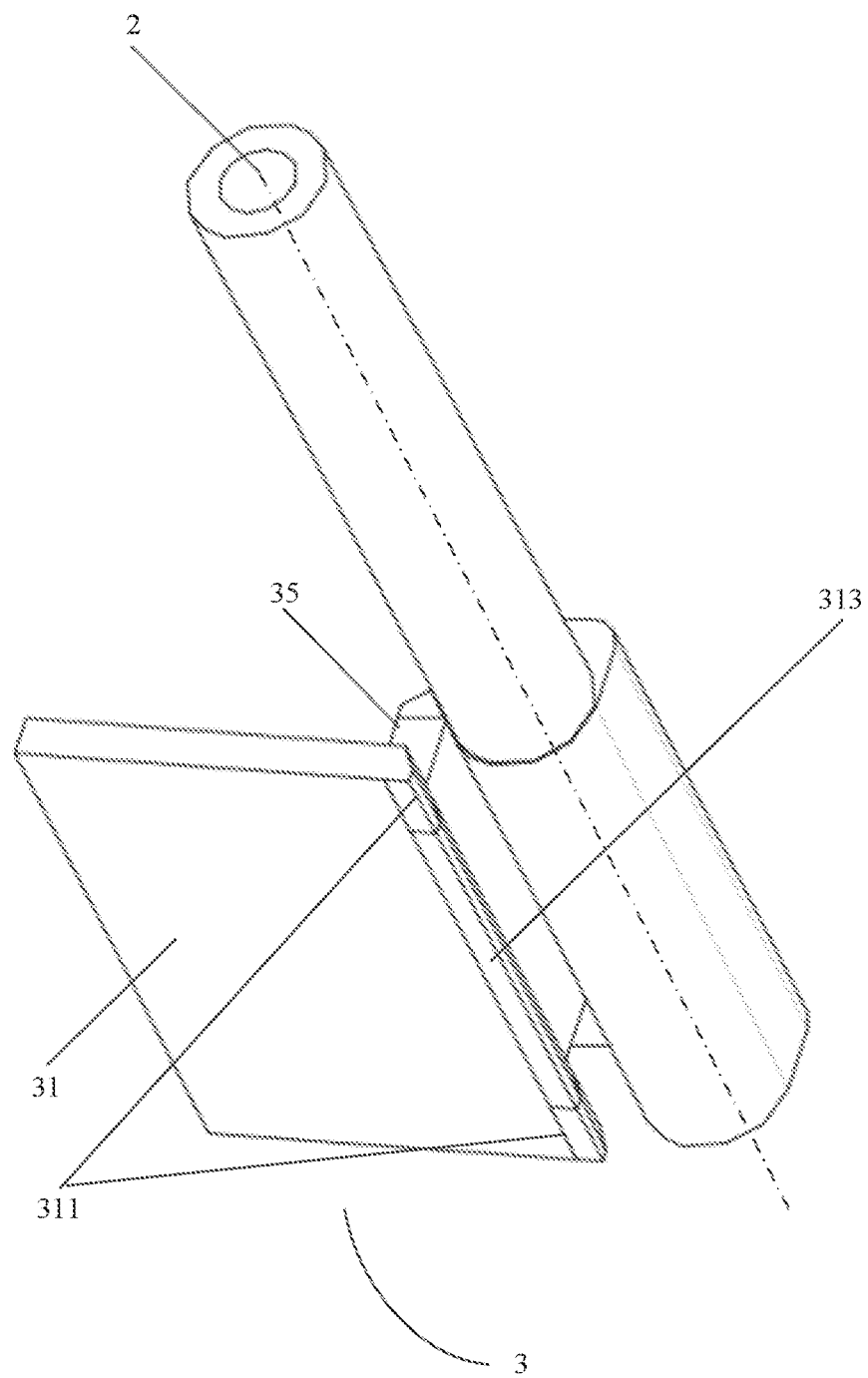
Figure 9A:
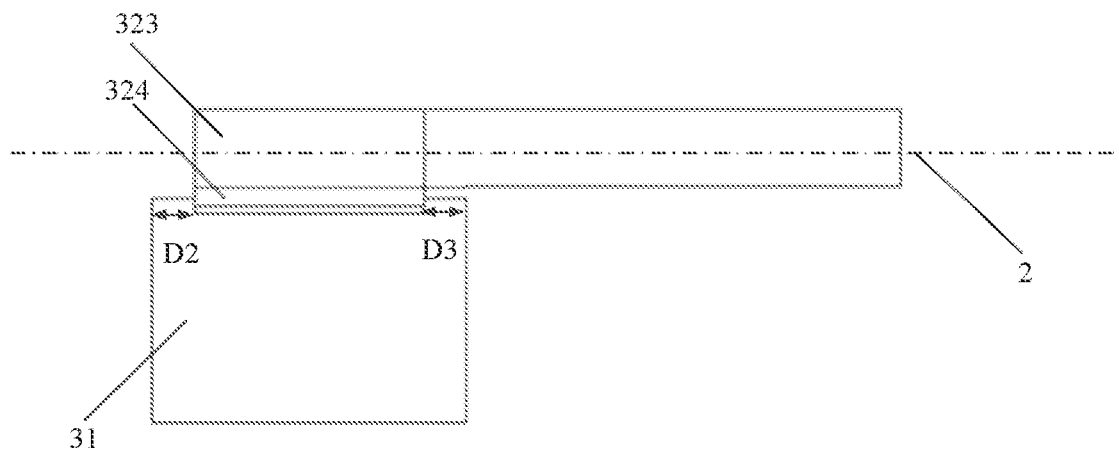
Figure 9B:
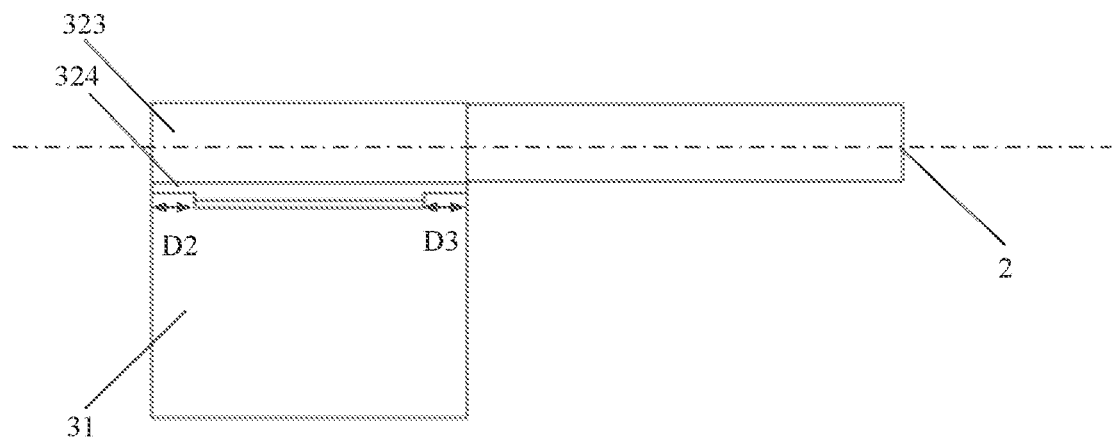
Figure 10:
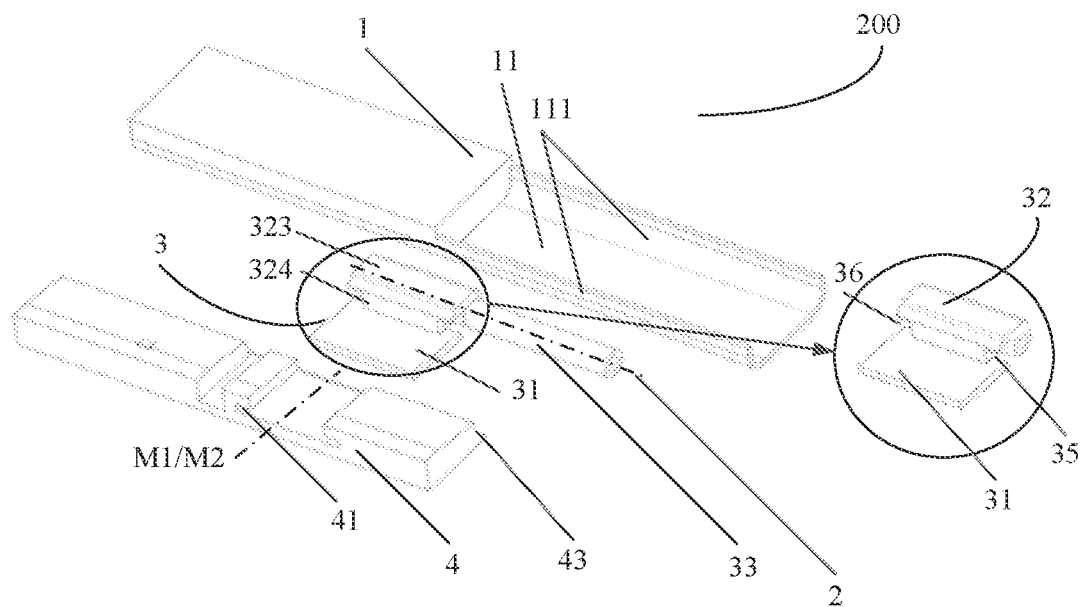
Figure 11:
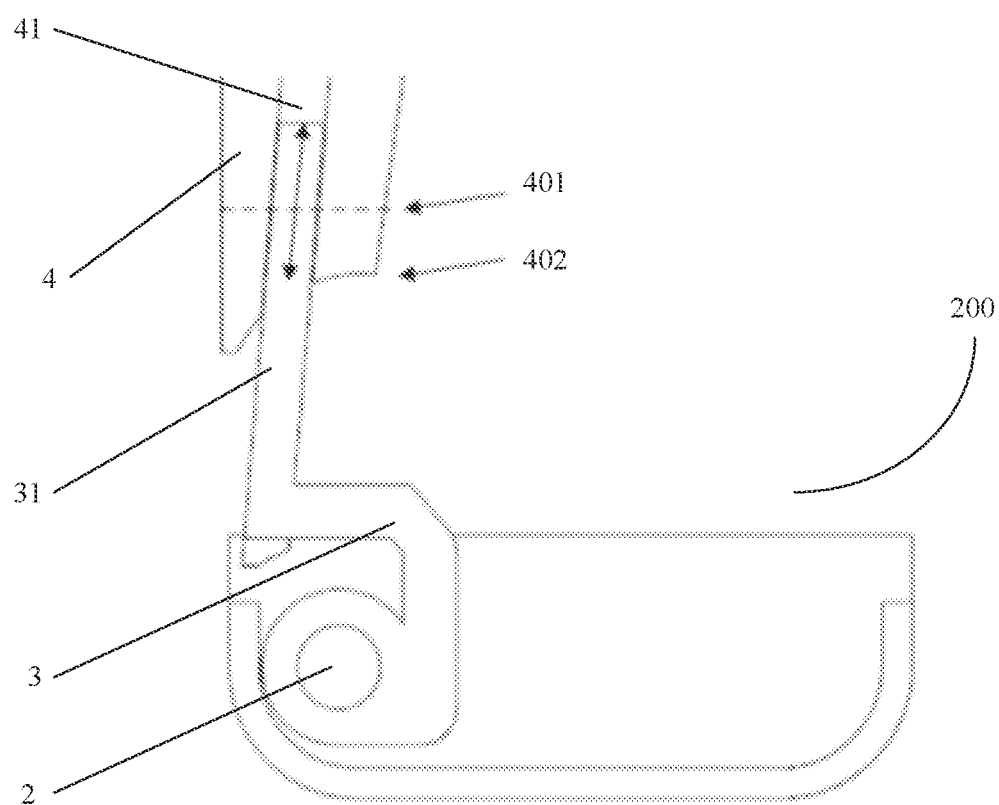

FIG. b is a schematic diagram of a structure of a foldable screen device when being folded;

FIG. 4a is an exploded view of a rotating shaft mechanism according to an embodiment of this application;

FIG. 4b is a schematic diagram of a structure of a second rotating component in the rotating shaft mechanism in FIG. 4a according to an embodiment of this application;

FIG. 5a is a schematic diagram showing assembly of a rotating shaft mechanism according to an embodiment of this application;

FIG. 5b is an A-A sectional view of the rotating shaft mechanism in FIG. 5a according to an embodiment;

FIG. 6a is a schematic diagram showing assembly of a rotating shaft mechanism according to an embodiment of this application;

FIG. 6b is a B-B sectional view of the rotating shaft mechanism in FIG. 6a according to an embodiment;

FIG. 6c is a schematic diagram of a structure of a first rotating component in the rotating shaft mechanism in FIG. 6a according to an embodiment;

FIG. 7a is a schematic diagram showing assembly of a rotating shaft mechanism according to an embodiment of this application;

FIG. 7b is a C-C sectional view of the rotating shaft mechanism in FIG. 7a according to an embodiment;

FIG. 7c is a D-D sectional view of the rotating shaft mechanism in FIG. 7a according to an embodiment;

FIG. 8a is a schematic diagram of a structure of a second rotating component in a rotating shaft mechanism according to an embodiment of this application;

FIG. 8b is a schematic diagram of a structure of a second rotating component in a rotating shaft mechanism according to an embodiment of this application;

FIG. 9a is a schematic diagram of a structure of a second rotating component in a rotating shaft mechanism according to an embodiment of this application;

FIG. 9b is a schematic diagram of a structure of a second rotating component in a rotating shaft mechanism according to an embodiment of this application;

FIG. 10 is an exploded view of a rotating shaft mechanism according to an embodiment of this application; and FIG. 11 is a schematic diagram of a structure of a rotating shaft mechanism according to an embodiment of this application.

1—Shaft cover, 11—Support wall structure, 111—Side wall; 2—Rotating shaft; 3—Second rotating component, 31—Slider, 311—Protruding portion, 312—Second arc surface. 313—Connecting piece, 32—Connection portion, 321—First end. 322—Second end, 323—First connecting piece, 324—Second connecting piece, 33—Rotating portion, 34—Gap, 35—First groove, 36—Second groove, 37—Outer lateral surface; 4—First rotating component; 401—Third end; 402—Fourth end; 41—Chute; 411—End; 412—Opening; 42—End face; 43—First arc surface; 5—Flexible screen; 6—Middle frame; 200—Rotating shaft mechanism; 800—Body.

DESCRIPTION OF EMBODIMENTS

In recent years, display technologies for electronic devices have developed rapidly, especially a flexible screen that can be bent and folded has emerged, so that more product forms of the electronic devices can be developed, among which a foldable screen device is a currently emerging product form, A flexible screen implements bending and folding of a screen. After a screen of a conventional electronic device is replaced with a flexible screen, the electronic device can be fielded, and the electronic device has a larger display area without increasing a product volume.

Figure 1:
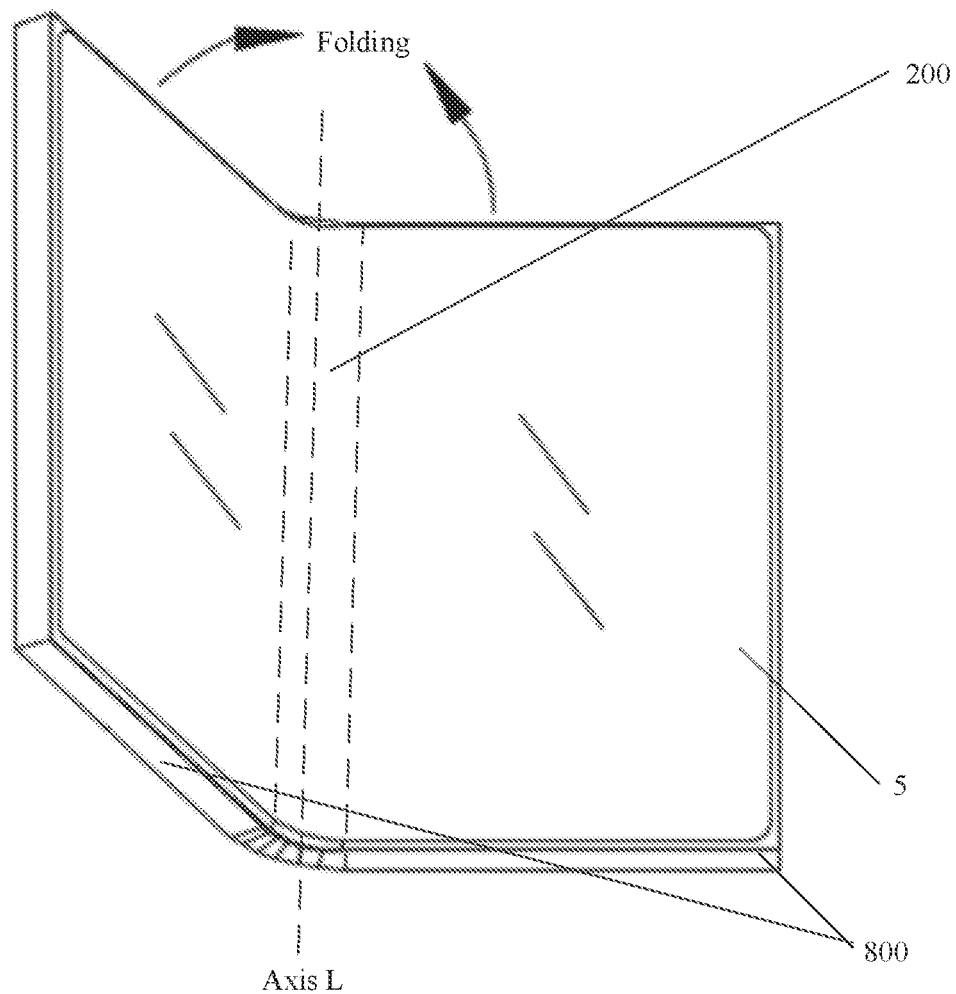
FIG. 1 is a schematic diagram of a structure of a current foldable screen device.

FIG. 1 is a schematic diagram of a structure of a current foldable screen device. As shown in FIG. 1, the foldable screen device includes a rotating shaft mechanism 200, a body 800, and a flexible screen 5. The rotating shaft mechanism 200 is disposed close to a bending area of the foldable screen device, and the rotating shaft mechanism 200 may implement folding and unfolding with an axis L as a center. The body 800 is a two-part structure bounded by the axis L. Two ends of the rotating shaft mechanism 200 are respectively connected to the two-part structure of the body 800, and are configured to support the two-part structure of the body 800 to be folded and unfolded around the axis L. In this way the body 800 can be folded to a side of the flexible screen 5, and the flexible screen 5 is hidden on an inner side of the body 800 of the electronic device after the body 800 of the electronic device is folded, so that the flexible screen 5 is hidden when the body 800 is in a folded state of the body 800, and is visible when the body 800 in an unfolded state.

Figure 2A:
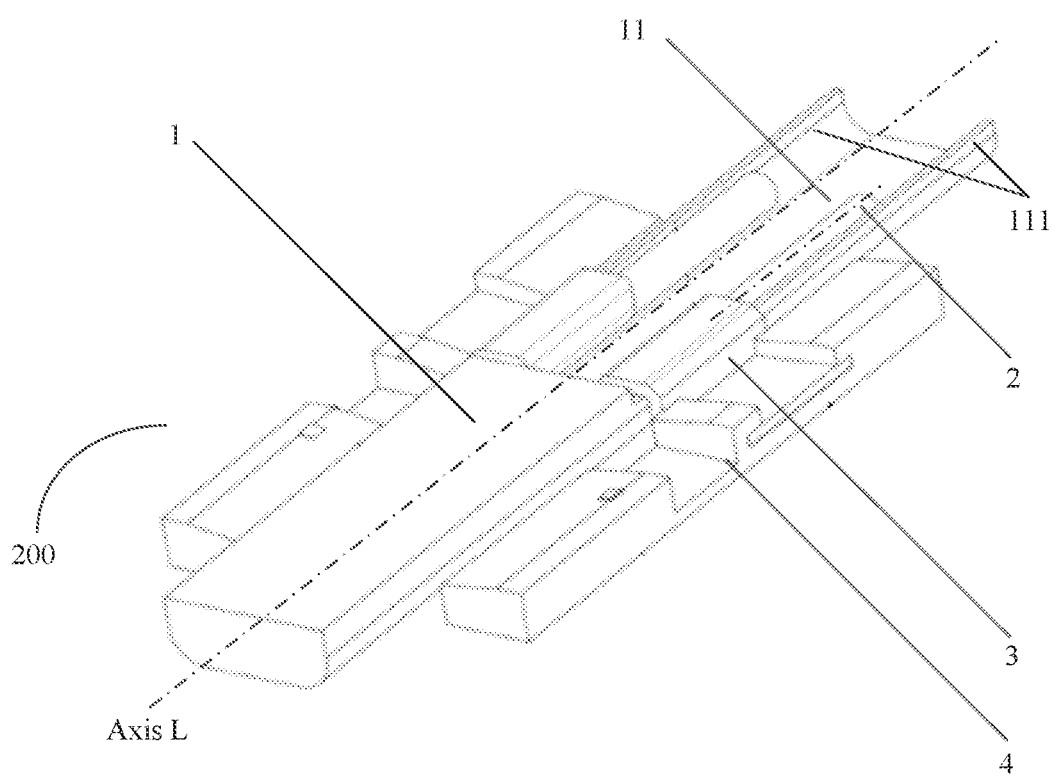
FIG. 2a is a schematic diagram of a structure of a current rotating shaft mechanism.

FIG. 2a is a schematic diagram of a structure of a current rotating shaft mechanism 200. As shown in FIG. 2a, the rotating shaft mechanism 200 includes a shaft cover 1 and first rotating components 4 disposed on both sides of the spindle cover 1. Each first rotating component 4 forms a rotational connection to the shaft cover 1 by using a second rotating component 3. The shaft cover 1 includes a support wall structure 11, the support wall structure 11 has a U-shaped cross-section in a direction perpendicular to the axis L in which the foldable screen device is bent, and extends for a certain distance along a direction parallel to the axis to form a U-shaped wall surface. The U-shaped wall surface forms two side walls 111 on both sides of the axis L.

The second rotating part 3 rotates relative to the shaft cover 1, and the rotating shaft is a rotating shaft 2. The rotating shaft 2 is located on an inner side of the side wall, and the inner side of the side wall is a side facing away from the second rotating component.

Figure 2B:
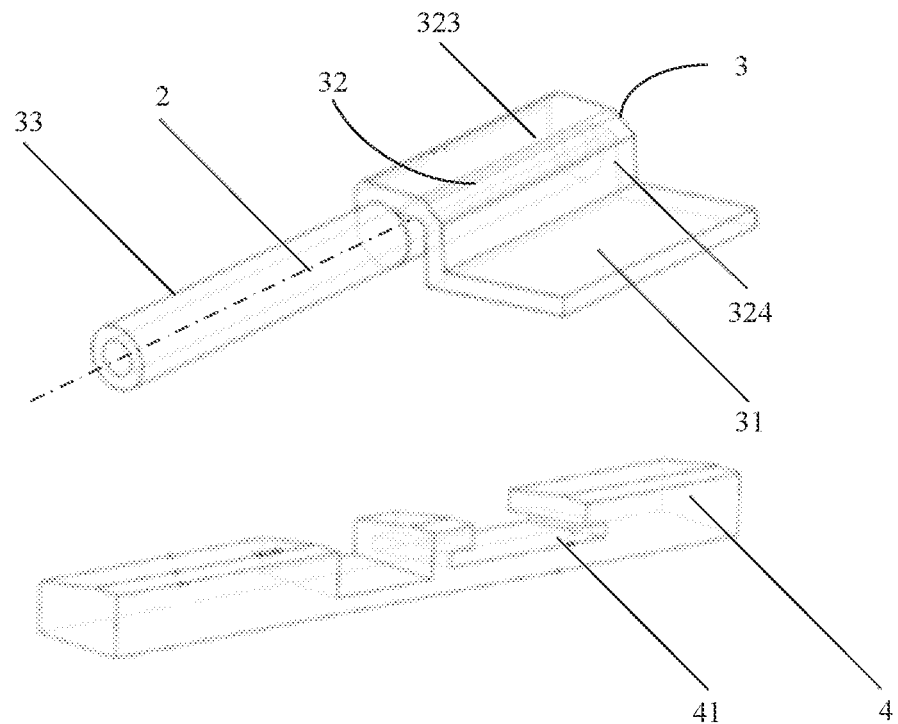
FIG. 2b is a schematic diagram of a split current rotating shaft mechanism.

FIG. 2b is a schematic diagram of a split current rotating shaft mechanism. As shown in FIG. 2h, the second rotating component 3 includes a slider 31, a connection portion 32, and a rotating portion 33. Mounting holes are disposed at two ends of the rotating portion 33, and the mounting holes are used to connect to a rotation structure on the shaft cover 1 to implement rotational connection between the rotating portion 33 and the rotation structure. In this case, an axis of the rotating portion 33 coincides with the rotating shaft 2. In this way, the rotating portion 33 forms a rotational connection to the rotating shaft 2, and the second rotating component 3 can rotate around the rotating shaft 2. The connection portion 32 includes a first connecting piece 323 and a second connecting piece 324. The first connecting piece 323 extends along a tangential direction of the rotating portion 33 in a direction away from the rotating shaft 2, one end of the first connecting piece 323 is connected to the rotating portion 33, the other end of the first connecting piece 323 is connected to the second connecting piece 324, and an included angle (optionally, the included angle is 90°) is formed between the first connecting piece 323 and the second connecting piece 324, to form an L-shaped structure, so that when the second rotating component 3 rotates around the rotating portion 33, one side of the first connecting piece 323 and one side of the second connecting piece 324 that are close to the shaft cover 1 do not interfere with the shaft cover 1. One end of the slider 31 is connected to an end that is of the second connecting piece 324 and that is away from the first connecting piece 323, and the other end extends for a specified distance in a direction away from the rotating shaft 2. The first rotating component 4 is provided with a chute 41 that matches a size and a shape of the slider 31.

Figure 3A:
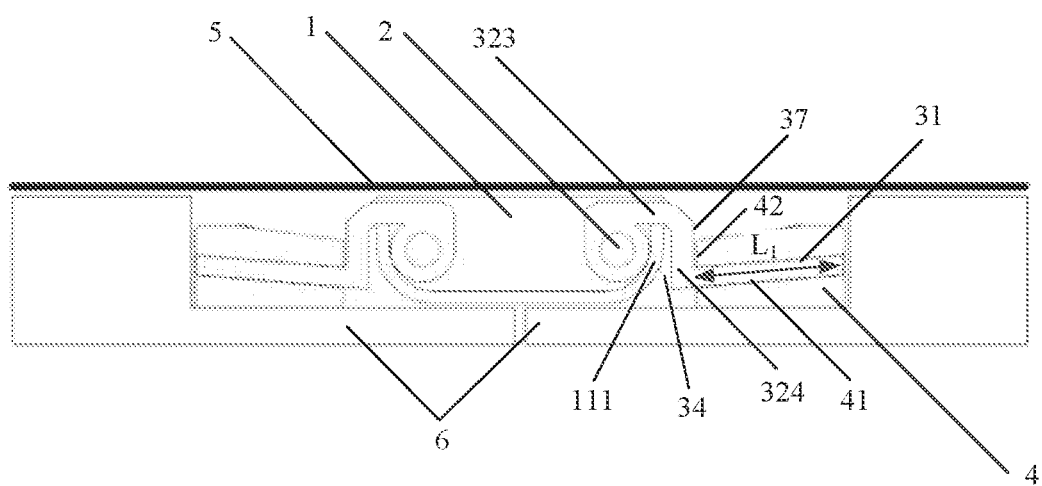
FIG. 3a is a schematic diagram of a structure of a foldable screen device when being flattened.

FIG. 3a is a schematic diagram of a structure of a foldable screen device when being flattened. As shown in FIG. 3a, a flexible screen 5 is disposed on a side that is of the first connecting piece 323 and that faces away from the rotating shaft 2, the flexible screen 5 is connected to a middle frame 6 of the foldable screen device, and the middle frame 6 is connected to the first rotating component 4. Because the slider 31 is inserted into the chute 41 to form a sliding constraint, in a flattening process of the foldable screen device, when the second rotating component 3 rotates relative to the rotating shaft 2, the first rotating component 4 rotates relative to the rotating shaft 2 with rotation of the second rotating member 3. The middle frame 6 is connected to the first rotating component 4, and the middle frame 6 is connected to the flexible screen 5. Therefore, when the first rotating component 4 is rotating relative to the rotating shaft 2, to ensure that a screen length is almost unchanged, the middle frame 6 and the shaft cover 1 slide relative to and have a smaller distance between each other. Both the middle frame 6 and the shalt cover 1 are fixed-sized components. Therefore, relative sliding of the middle frame 6 and the shaft cover 1 is implemented through relative movement of the first rotating component 4 and the second rotating component 3. Relative movement of the first rotating component 4 and the second rotating component 3 is implemented based on a movement constraint of the slider 31 and the chute 41. Similarly, in a folding process, the middle frame 6 and the shaft cover 1 may slide relative to and have a longer distance between each other, which is also implemented by the sliding constraint between the slider 31 and the chute 41.

As shown in FIG. 3a, when the foldable screen device is flattened, the slider 31 is inserted into the chute 41, and an overlapping length between the slider 31 and the chute 41 is $L_1$, $L_1$ is a maximum overlapping length between the second rotating component 3 and the first rotating component 4 (that is, the slider 31 and the chute 41) in a flattening or folding process of the rotating shaft mechanism 200. In this case, an end face 42 that is of the first rotating component 4 and that is close to the rotating shaft 2 is clamped on an outer lateral surface 37 of the second connecting piece 324.

It can be understood that, to ensure a flatness requirement of the flexible screen 5 when the flexible screen 5 is flattened, that is, to ensure a height relationship between an upper surface that is of the first rotating component 4 and that is close to the flexible screen 5 and an upper surface that is of the shaft cover and that is close to the flexible screen 5, an included angle (optionally, the included angle is 90°) is formed between the first connecting piece 323 and the second connecting piece 324, so that there is a height difference between an upper surface that is of the slider 31 and that is close to the flexible screen 5 and the upper surface that is of the shaft cover and that is close to the flexible screen 5. The height difference may be used to compensate for a thickness of an upper part of the chute 41 in the first rotating component 4. In this case, it should be noted that when the second rotating component 3 rotates around the rotating shaft 2, the second rotating component 3 cannot interfere with the shaft cover 1. Therefore, a gap 34 is formed between the first connecting piece 323, the second connecting piece 324, and the shaft cover 1. As shown in FIG. 3a, optionally, the first connecting piece 323, the second connecting piece 324, and the side wall 111 form the gap 34.

Figure 3B:
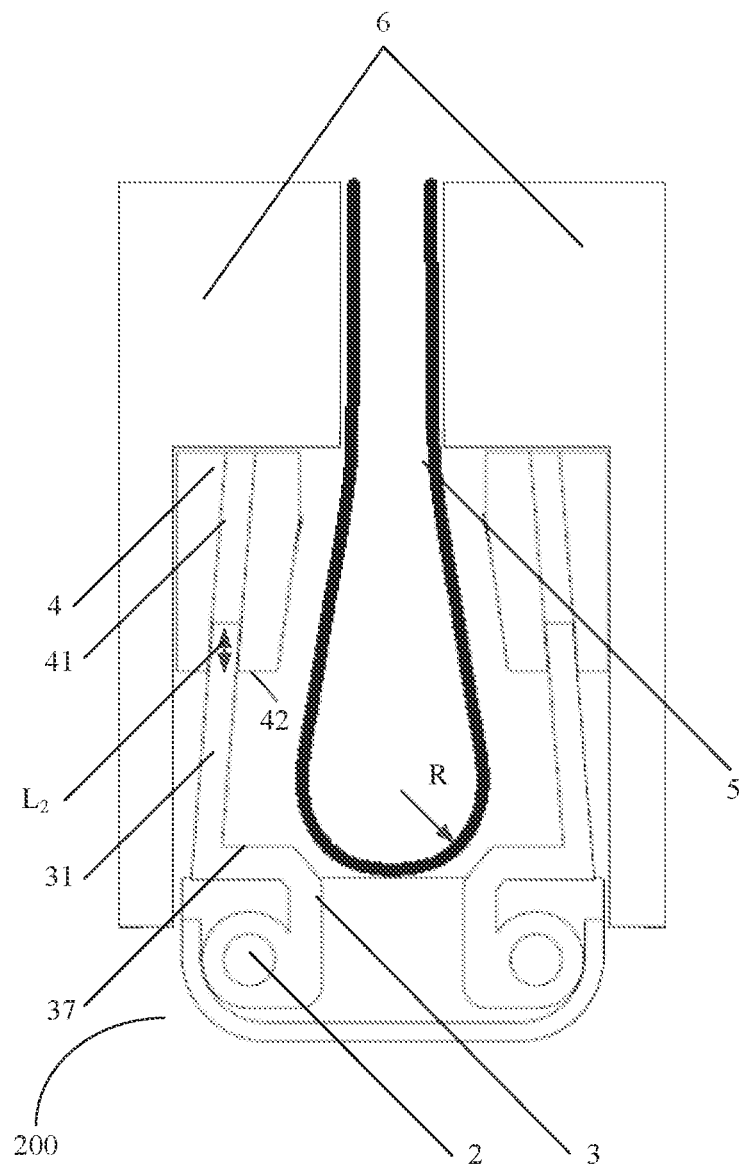

FIG. 3b is a schematic diagram of a structure of a foldable screen device when being folded. As shown in FIG. 31), the rotating shaft mechanism 200 is folded, and the flexible screen 5 is folded. When the rotating shaft mechanism 200 is folded, the slider 31 is inserted into the chute 41, and an overlapping length between the slider 31 and the chute 41 is $L_2$, $L_2$ is a minimum overlapping length between the second rotating component 3 and the first rotating component 4 (that is, between the slider 31 and the chute 41) in a flattening or folding process of the rotating shaft mechanism 200. In this case, the end face 42 that is of the first rotating component 4 and that is close to the rotating shaft 2 is away from the outer lateral surface 37 of the second connecting piece 324. The overlapping length $L_1$ is greater than the overlapping length $L_2$.

Referring to FIG. 3a and FIG. 3b, the slider 31 is inserted into the chute 41, and movement of the first rotating component 4 is limited by sliding cooperation between the chute 41 and the slider 31, so that when the rotating shaft mechanism 200 is flattened, the second rotating component 3 and the first rotating component 4 come close to each other and on the contrary, when the rotating shaft mechanism 200 is folded, the second rotating component 3 and the first rotating component 4 move away from each other. In a process in which the second rotating component 3 and the first rotating component 4 rotate around the rotating shaft 2 from a horizontal direction to a vertical direction, an overlapping length between the slider 31 and the chute 41 gradually decreases from $L_1$ to b, and a shorter overlapping length between the slider 31 and the chute 41 causes the first rotating component 4 to be farther away from the outer lateral surface 37 of the second connecting piece 324, and the screen gradually bends and finally folds. The rotating shaft mechanism 200 adjusts, by the sliding constraint between the slider 31 and the chute 41, relative sliding between the middle frame 6 and the shaft cover 1, to ensure that a length of the flexible screen is almost unchanged. In addition, to ensure that there is still a relatively strong stability constraint after folding, there is also a size requirement for a minimum overlapping length between the slider 31 and the chute 41. As shown in FIG. 3a, the overlapping length $L_2$ is usually greater than a design threshold, for example, 3 mm. However, the requirement for the minimum overlapping length also increases a width occupied by the rotating shaft mechanism 200 after flattening, that is, space of the gap 34 shown in FIG. 3a is not fully used, and consequently, space utilization of the entire device is low.

FIG. 4a is an exploded view of a rotating shaft mechanism according to an embodiment of this application. As shown in FIG. 4a, the rotating shaft mechanism includes a shaft cover 1 and first rotating components 4 disposed on both sides of the shaft cover 1. A second rotating component 3 is disposed between the first rotating component 4 and the shaft cover 1, the first rotating component 4 is slidably connected to the second rotating component 3, and the second rotating component 3 is configured to rotate relative to the shaft cover 1, so that the first rotating component 4 and the shaft cover 1 form a rotational connection. The shaft cover 1 includes a side wall 111 facing the first rotating component 4, a rotating shaft 2 of the second rotating component 3 is located on an inner side of the side wall 111, and the inner side of the side wall 111 is a side facing away from the second rotating component 3. The second rotating component 3 includes a connection portion 32 and a slider 31, and the connection portion 32 includes a first end 321 located between the first rotating component 4 and the side wall 111; and one end of the slider 31 is connected to the first end 321 of the connection portion 32. The first rotating component 4 includes a chute 41, and the chute 41 is slidably connected to the slider 31, so that the chute 41 overlaps the second rotating component 3; and the chute 41 extends for a fourth distance D4 in a direction close to the rotating shaft 2. It can be understood that, provided that the first rotating component 4 does not interfere with a support wall structure 11, the fourth distance D4 should be as large as possible. In this way, maximum space utilization of the entire device is ensured, FIG. 4b is a schematic diagram of a structure of a second rotating component in the rotating shaft mechanism in FIG. 4a according to an embodiment of this application. As shown in FIG. 4b, in an embodiment, one end of the slider 31 is connected to the first end 321 of the connection portion 32, and the other end extends for a first distance D1 in a direction away from the side wall 111; and the slider 31 separately has a second distance D2 and a third distance D3 from two end faces of the connection portion 32 along a direction of the rotating shaft 2.

As shown in FIG. 4a, in an embodiment, the shaft cover 1 includes a support wall structure 11, the support wall structure 11 has a U-shaped cross-section in a direction that is perpendicular to a rotating shaft 2 and in which the foldable screen device is bent, and extends for a certain distance along a direction parallel to the rotating shaft 2 to form a U-shaped wall surface. The U-shaped wall forms two side walls 111 on both sides of an axis of the shaft Cover.

FIG. 5a is a schematic diagram showing assembly of a rotating shaft mechanism according to an embodiment of this application. FIG. 5b is an A-A sectional view of the rotating shaft mechanism in FIG. 5a according to an embodiment. As shown in FIG. 5a and FIG. 5b, when the rotating shaft mechanism is unfolded, one end 411 that is of a chute 41 and that is close to a rotating shaft 2 extends beyond a first end 321, to increase an overlapping length between the chute 41 and a second rotating component 3. In this application, the slot 41 extends for a certain length in a direction in which the rotating shaft 2 extends, so that when the rotation shaft mechanism is unfolded, an overlapping length between the second rotating component 3 and the first rotating component 4 includes an overlapping length between the slider 31 and the chute 41 and an overlapping length between the second connecting piece 324 and the chute 41. Compared with the existing structure shown in FIG. 3a, the overlapping length between the second rotating component 3 and the first rotating component 4 increases the overlapping length between the second connecting piece 324 and the chute 41. When a same maximum overlapping length $L_1$ is ensured, in this application, a length of the first rotating component 4 may be narrowed, that is, a total length of the rotating shaft mechanism 200 may be narrowed. In addition, when the rotating shaft mechanism is folded, an overlapping length between the chute 41 and the second rotating component 3 increases. FIG. 6a is a schematic diagram showing assembly of a rotating shaft mechanism according to an embodiment of this application. FIG. 6b is a B-B sectional view of the rotating shaft mechanism in FIG. 6a according to an embodiment. FIG. 6c is a schematic diagram of a structure of a first rotating component in the rotating shaft mechanism in FIG. Ca according to an embodiment. As shown in FIG. 6a, FIG. 6b, and FIG. 6c, an opening 412 matching a position of a connection portion 32 in the direction of a rotating shaft 2 is disposed on an end face that is of a chute 41 and that is close to the connection portion 32, a width of the opening 412 in the direction of the rotating shaft 2 is greater than or equal to a width of the connection portion 32 in the direction of the rotating shaft 2, and the width of the opening 412 in the direction of the rotating shaft 2 is less than a width of the chute 41 in the direction of the rotating shaft 2. One end 411 that is of a chute 41 and that is close to the rotating shaft 2 extends beyond a first end 321, to increase an overlapping length between the chute 41 and a second rotating component 3. In this way, the connection portion 32 does not interfere with the extended part of the chute 41.

As shown in FIG. 6c, a width of the opening 412 along a direction perpendicular to the rotating shaft 2 is less than a width of the connection portion. It can be understood that, the width of the opening 412 along the direction perpendicular to the rotating shaft 2 is greater than the width of the connection portion. As shown in FIG. 4a, in an embodiment, the opening 412 runs through the first rotating component 3 in a direction perpendicular to the rotating shaft 2.

FIG. 7a is a schematic diagram showing assembly of a rotating shaft mechanism according to an embodiment of this application. FIG. 7b is a C-C sectional view of the rotating shaft mechanism in FIG. 7a according to an embodiment. As shown in FIG. 7a and FIG. 7b, the second rotating component 3 includes a slider 31, a protruding portion 311, and a connection portion 32. The connection portion 32 includes a first end 321 located between the first rotating component 4 and a side wall 111. One end of the slider 31 is connected to a first end 321 of the connection portion 32, and the other end extends for a first distance along a direction away from the side wall 111. One end of the protruding portion 311 is connected to the first end 321 of the connection portion 32, and the other end extends for a certain distance in a direction close to the side wall 111. The slider 31 and the protruding portion 311 are located in a same plane. The first rotating component 4 includes a chute 41, and the chute 41, the protruding portion 311, and a slider 31 are slidably connected, so that the chute 41 overlaps the second rotating component 3, and the protruding portion 311 is configured to increase an overlapping length between the chute 41 and the second rotating component 3. The first distance should ensure that when the rotating shaft mechanism is unfolded, the slider 31 does not interfere with any component, and when the protruding portion 311 does not interfere with a shaft cover, a greater distance the protruding portion 311 extends for in a direction close to the side wall 111, the better, so that the protruding portion 311 extends to a position close to the outer side of the side wall. In this way, a gap 34 formed between the first connecting piece 323, the second connecting piece 324, and the shaft cover 1 is effectively used, and an original rotation function is ensured.

FIG. 7c is a D-D sectional view of the rotating shaft mechanism in FIG. 7a according to an embodiment. As shown in FIG. 7b and FIG. 7c, when the rotating shaft mechanism is unfolded, one end 411 that is of the chute 41 and close to a rotating shaft 2 extends beyond the first end 321, to increase an overlapping length between the chute 41 and the second rotating component 3.

As shown in FIG. 7b, in an implementation, a second arc surface 312 matching a size and a shape of the side wall 111 is disposed on an end that is of the protruding portion 311 and that is close to the rotating shaft 2, so that when the second rotating portion 3 is rotating around the rotating shaft 2, the protruding portion 311 does not interfere with a support wall structure 11.

As shown in FIG. 7b, in an implementation, the connection portion 32 includes a first connecting piece 323, a second connecting piece 324, and a second end 322 located on an inner side of the side wall 111. An included angle is formed between the first connecting piece 323 and the second connecting piece 324 to form an L-shape. One end of the first connecting piece 323 is the second end 322, which is tangentially connected to the rotating portion 33. The other end of the first connecting piece 323 extends along a direction away from the rotating shaft 2 along a tangential direction of the rotating portion 33, and is connected to one end of the second connecting piece 324. The other end of the second connecting piece 324 is the first end 321, and is connected to the slider 31. When the second rotating component 3 is rotating around the rotating portion 33, one side of the first connecting piece 323 and that of the second connecting piece 324 that are close to the shaft cover 1 do not interfere with the shaft cover 1.

FIG. 8a is a schematic diagram of a structure of a second rotating component in a rotating shaft mechanism according to an embodiment of this application. As shown in FIG. 8a, in an embodiment, a second rotating component 3 includes a protruding portion 311, a rotating portion 33, a connection portion 32, and a slider 31. The rotating portion 33 may be a lever component, or may be a pin hole, and both can implement rotational connection between the rotating portion 33 and a rotation structure. In this case, an axis of the rotating portion 33 coincides with a rotating shaft 2, the rotating portion is connected to the second end 322 of the connection part 32, the rotating portion 33 rotates relative to a shaft cover 1, and the axis of the rotating portion 33 coincides with the rotating shaft 2. In this way, the rotating portion 33 forms a rotational connection to the rotating shaft 2, and a second rotating component 3 can rotate around the rotating shaft 2. In an example, the rotating portion 33, the connection portion 32, the slider 31, and the protruding portion 311 are of an integrated structure. In this application, the chute 41 extends for a certain length in a direction in which the protruding portion 311 extends, so that when the rotation shaft mechanism 200 is unfolded, the protruding portion 311 and the chute 41 completely overlap each other. In this case, an overlapping length between the second rotating component 3 and the first rotating component 4 includes an overlapping length between the slider 31 and the chute 41, a thickness of a second connecting piece 324, and an overlapping length between the chute 41 and the protruding portion 311. Compared with the existing structure shown in FIG. 3a, the overlapping length between the second rotating component 3 and the first rotating component 4 increases the thickness of the second connecting piece 324 and the overlapping length between the chute 41 and the protruding portion 311. That is, when a same maximum overlapping length $L_1$ is ensured, in this application, a length of the first rotating component 4 may be narrowed, that is, a total length of the rotating shaft mechanism 200 may be narrowed. In addition, when the rotating shaft mechanism is folded, an overlapping length between the chute 41 and the second rotating component 3 increases.

As shown in FIG. 8a, in an embodiment, the second rotating component 3 further includes two protruding portions 311. One end of the protruding portion 311 is connected to the first end 321 of the connection portion 32, and the other end extends for a certain distance in a direction close to the side wall III. The slider 31 and the protruding portion 311 are located in a same plane. The two protruding portions 311 are separately disposed at two ends of the slider 31 along a direction of the rotating shaft 2.

FIG. 8b is a schematic diagram of a structure of a second rotating component in a rotating shaft mechanism according to an embodiment of this application. As shown in FIG. 8b, in an implementation, the second rotating component 3 further includes a connecting piece 313. One end of the connecting piece 313 is connected to the first end 321 of the connection portion 32, the other end extends for a certain distance in a direction close to the side wall 111, and the connecting piece 313 and the protruding portion 311 are in a same plane. End faces of the connecting piece 313 in the direction of the rotating shaft 2 are respectively connected to the two protruding portions 311.

In an implementation, the slider 31 is a sheet-like structure parallel to a direction of a tangential plane of a central axis, to reduce a device thickness.

FIG. 9a is a schematic diagram of a structure of a second rotating component in a rotating shaft mechanism according to an embodiment of this application. As shown in FIG. 4a and FIG. 9a, one end of the slider 31 is connected to an end that is of the second connecting piece 324 and that is away from the first connecting piece 323, and the other end extends for a specified distance in a direction away from the rotating shaft 2. A width of the second connecting piece 324 is less than a width of the slider 31, the second connecting piece 324 is disposed between two end faces of the slider 31 along a direction of the rotating shaft 2, and the second connecting piece 324 separately has a distance D2 and a distance D3 from the two end faces of the slider 31 along the direction of the rotating shaft 2, and the distance D2 and the distance D3 may be equal. In this case, the second connecting piece 324, the slider 31, and the first connecting piece 323 separately form a first groove 35 and a second groove 36 on both ends of the slider 31.

FIG. 9b is a schematic diagram of a structure of a second rotating component in a rotating shaft mechanism according to an embodiment of this application. As shown in FIG. 9b, an embodiment, a width of the first connecting piece 323 is greater than a width of the second connecting piece 324. The second connecting piece 324 is disposed between the two end faces of the first connecting piece 323 along the direction of the rotating shaft 2, and the second connecting piece 324 separately has a distance D2 and a distance D3 from the two end faces of the first connecting piece 323 along the direction of the rotating shaft 2. The distance D2 and the distance D3 may be equal.

FIG. 10 is an exploded view of a rotating shaft mechanism according to an embodiment of this application. As shown in FIG. 10, in an embodiment, both central axes M1 and M2 of a chute 41 and an opening 412 may be perpendicular to a direction of a rotating shaft 2, and the chute 41 and the opening 412 are connected with each other. A width of the chute 41 along the rotating shaft 2 is less than a width of the opening 412 along the rotating shaft 2, so that the slider 31 may be clamped into the opening 412. A shape and a size of the chute 41 match a second connecting piece 324, and the opening 412 matches a shape and a size of the slider 31. In this way, the slider 31 is inserted into the opening 412, and movement of a first rotating component 4 is limited through sliding cooperation between the chute 41 and the slider 31. When an overlapping length of the chute 41 and the slider 31 gradually increases, the second connecting piece 324 slides into the chute 41 with sliding of the slider 31, and finally the rotating shaft mechanism is flattened. It can be understood that, for a disposing position of the first rotating component 4 when the shaft mechanism 200 is flattened, provided that the first rotating component 4 does not interfere with a support wall structure 11, the disposing position of the first rotating component 4 should be as close as possible to the support wall structure 11. As shown in FIG. 9b and FIG. 10, in an implementation, the width of the first connecting piece 323 is greater than the width of the second connecting piece 324. In this case, the second connecting piece 324, the slider 31, and the first connecting piece 323 separately form a first groove 35 and a second groove 36 on both ends of the slider 31. The first groove 35 and the second groove 36 are U-shaped grooves. In this way, the slider 31 is inserted into the opening 412, and movement of a first rotating component 4 is limited by sliding cooperation between the chute 41 and the slider 31. When an overlapping length of the chute 41 and the slider 31 gradually increases, the second connecting piece 324 slides into the chute 41 with sliding of the slider 31 through the first groove 35 and the second groove 36. In addition, the first connecting piece 323 is outside the chute 41, so that between the second rotating component 3 and the first rotating component 4, there is a constraint between the opening 412 and the slider 31 in a direction perpendicular to the rotating shaft 2, and there is a constraint between each of the first groove 35 and the second groove 36 and the chute 41 in the direction perpendicular to the rotating shaft 2. In this way, double constraints make the connection between the second rotating component 3 and the first rotating component 4 more reliable.

In an implementation, a first arc surface 43 matching a size and a shape of the support wall structure 11 is disposed on an end that is of the first rotating component 4 and that is close to the rotating shaft 2. In this way, provided that the first rotating component 4 does not interfere with the support wall structure 11, a disposing position of the first rotating component 4 can be as close as possible to the support wall structure 11.

FIG. 11 is a schematic diagram of a structure of a rotating shaft mechanism according to an embodiment of this application. As shown in FIG. 11, when the rotating shaft mechanism 200 is folded, an overlapping length between a second rotating component 3 and a first rotating component 4 is an overlapping length between a slider 31 and a chute 41. In this case, in a flattening or folding process of the rotating shaft mechanism 200, an overlapping length between the second rotating component 3 and the first rotating component 4 is the shortest. In this application, the chute 41 is inversely lengthened, so that when the total length of the shaft mechanism 200 is fixed, a third end 401 of the first rotating component of an existing rotating shaft mechanism is located above a fourth end 402 of the first rotating component of the rotating shaft mechanism of this application. That is, an overlapping length between the slider 31 and the chute 41 is longer. Therefore, when the rotating shaft mechanism 200 has a same minimum overlapping length $L_2$ in a folded state, an overlapping length $L_1$ in a flattened state can be shortened, so that a total length (a length is a distance perpendicular to a direction of the rotating shaft 2) of the rotating shaft mechanism 200 in the flattened state can be shortened, thereby improving space utilization of the entire device.

Referring to FIG. 7b, in an implementation, when the rotating shaft mechanism 200 is flattened, an end that is of the chute 41 and that is close to the rotating shaft 2 is closer to the support wall structure 11 than an end that is of the second connecting piece 324 and that is close to the rotating shaft 2. In this way, in a flattening or folding process of the rotating shaft mechanism 200, a distance from each part of the second rotating component 3 to the rotating shaft 2 remains unchanged, but a distance between the first rotating component 4 and the rotating shaft 2 changes. When the shaft mechanism 200 is flattened, the first rotating component 4 is closest to the support wall structure 11, and is closer to a folding position of the rotating shaft mechanism 200. The first rotating component 4 is farthest from the support wall structure 11. Therefore, the first rotating component 4 may be closer to the support wall structure 11 provided that the second rotating component 3 and the first rotating component 4 do not interfere with the support wall structure 11. In this way, a total length (a length is a distance perpendicular to the direction of the rotating shaft 2) of the rotating shaft mechanism 200 in the flattened state can be shortened, and therefore space utilization of the entire device can be further improved.

An embodiment of this application further provides an electronic device, including the foregoing rotating shaft mechanism, middle frame, and flexible screen. The first rotating component in the rotating shaft mechanism is connected to the middle frame, and the middle frame is connected to the flexible screen, to implement rotation of the middle frame and the flexible screen with rotation of the rotating shaft mechanism. According to the rotating shaft mechanism provided in this embodiment of this application, an unfolding width of the rotating shaft mechanism can be narrowed, so that a width of the electronic device can be narrowed, thereby ensuring maximum space utilization of the entire device. In addition to a foldable screen phone, the electronic device described in this application may be a tablet computer, a notebook computer, a watch, or the like.

What is claimed is:

1. A rotating shaft mechanism, comprising:
a shaft cover and first rotating arms disposed on both sides of the shaft cover, wherein the shaft cover comprises a side wall facing one of the first rotating arms; and
a second rotating arm disposed between the one of the first rotating arms and the shaft cover, wherein the one of the first rotating arms is slidably connected to the second rotating arm, and the second rotating arm is configured to rotate relative to the shaft cover, so that the one of the first rotating arms and the shaft cover form a rotational connection, wherein the second rotating arm comprises:
a rotating shaft located on an inner side of the side wall, wherein the inner side of the side wall is a side facing away from the second rotating arm;
a connection portion comprising a first end located between the first rotating arm and the side wall; and
a slider, wherein one end of the slider is connected to the first end of the connection portion, and the other end extends for a first distance along a direction away from the side wall, and wherein the slider separately has a second distance and a third distance from two end faces of the connection portion in a direction of the rotating shaft,
wherein the first rotating arm comprises a chute that is slidably connected to the slider, such that the chute overlaps the second rotating arm,
wherein the chute extends for a fourth distance in a direction close to the rotating shaft,
wherein when the rotating shaft mechanism is being unfolded, an end of the chute that is close to the rotating shaft extends beyond the first end, to increase an overlapping length between the chute and the second rotating arm, and
wherein an opening matching a position of the connection portion in the direction of the rotating shaft is disposed on an end face of the chute that is close to the connection portion, a width of the opening in the direction of the rotating shaft is greater than or equal to a width of the connection portion in the direction of the rotating shaft, and the width of the opening in the direction of the rotating shaft is less than a width of the chute in the direction of the rotating shaft.

2. The rotating shaft mechanism of claim 1, wherein the opening runs through the one of the first rotating arms in a direction perpendicular to the rotating shaft.

3. The rotating shaft mechanism of claim 1, wherein the second rotating arm further comprises a rotating portion, wherein the connection portion further comprises a second end located on an inner side of the side wall, and wherein the rotating portion is connected to the second end of the connection portion, the rotating portion rotates relative to the shaft cover, and the rotating portion can rotate around the rotating shaft.

4. The rotating shaft mechanism of claim 3, wherein the connection portion comprises a first connecting piece and a second connecting piece, and there is an included angle between the first connecting piece and the second connecting piece to form an L-shaped structure, wherein one end of the first connecting piece is the second end, and is connected to the rotating portion, wherein the other end of the first connecting piece extends along a direction in which the rotating portion is away from the rotating shaft, and is connected to one end of the second connecting piece, and wherein the other end of the second connecting piece is the first end, and is connected to the slider.

5. The rotating shaft mechanism of claim 4, wherein a width of the first connecting piece is greater than a width of the second connecting piece, wherein the second connecting piece is disposed between two end faces of the first connecting piece in the direction of the rotating shaft, and wherein the second connecting piece, the slider, and the first connecting piece separately form a first groove and a second groove on both ends of the slider.

6. The rotating shaft mechanism of claim 1, wherein the second rotating arm further comprises a protruding portion, and wherein one end of the protruding portion is connected to the first end of the connection portion, the other end of the protruding portion extends for a certain distance in a direction close to the side wall, and the slider and the protruding portion are located in a same plane.

7. The rotating shaft mechanism of claim 6, wherein the second rotating arm comprises two protruding portions, and wherein the two protruding portions are distributed at two ends of the slider in the direction of the rotating shaft.

8. The rotating shaft mechanism of claim 7, wherein the second rotating arm further comprises a connecting piece, wherein one end of the connecting piece is connected to the first end of the connection portion, the other end of the connecting piece extends for a certain distance in a direction close to the side wall, and the connecting piece and the protruding portions are in a same plane, and wherein end faces of the connecting piece in the direction of the rotating shaft are separately connected to the two protruding portions.

9. The rotating shaft mechanism of claim 1, wherein the shaft cover comprises a support wall structure having a U-shaped cross-section in a direction perpendicular to the rotating shaft, wherein the support wall structure extends for a certain distance along a direction parallel to the rotating shaft to form a U-shaped wall surface, and wherein the U-shaped wall surface forms two side walls on both sides of an axis of the shaft cover.

10. The rotating shaft mechanism of claim 9, wherein a first arc surface matching a size and a shape of the side wall is disposed on an end of the one of the first rotating arms that is close to the rotating shaft.

11. An electronic device, comprising:
a middle frame;
a flexible screen connected to the middle frame; and
a rotating shaft mechanism, comprising:
  a shaft cover and first rotating arms disposed on both sides of the shaft cover, wherein at least one of the first rotating arms is connected to the middle frame to implement rotation of the middle frame and the flexible screen in response to rotation of the rotating shaft mechanism, and wherein the shaft cover comprises a side wall facing one of the first rotating arms; and
  a second rotating arm disposed between the one of the first rotating arms and the shaft cover, wherein the one of the first rotating arms is slidably connected to the second rotating arm, and the second rotating arm is configured to rotate relative to the shaft cover, such that the one of the first rotating arms and the shaft cover form a rotational connection, wherein the second rotating arm comprises:
    a rotating shaft located on an inner side of the side wall, wherein the inner side of the side wall is a side facing away from the second rotating arm;
    a connection portion comprising a first end located between the first rotating arm and the side wall; and
    a slider, wherein one end of the slider is connected to the first end of the connection portion, and the other end extends for a first distance along a direction away from the side wall, and wherein the slider separately has a second distance and a third distance from two end faces of the connection portion in a direction of the rotating shaft, wherein the first rotating arm comprises a chute that is slidably connected to the slider, such that the chute overlaps the second rotating arm,
wherein the chute extends for a fourth distance in a direction close to the rotating shaft,
wherein when the rotating shaft mechanism is being unfolded, an end of the chute that is close to the rotating shaft extends beyond the first end, to increase an overlapping length between the chute and the second rotating arm, and
wherein an opening matching a position of the connection portion in the direction of the rotating shaft is disposed on an end face of the chute that is close to the connection portion, a width of the opening in the direction of the rotating shaft is greater than or equal to a width of the connection portion in the direction of the rotating shaft, and the width of the opening in the direction of the rotating shaft is less than a width of the chute in the direction of the rotating shaft.

12. The electronic device of claim 11, wherein the opening runs through the one of the first rotating arms in a direction perpendicular to the rotating shaft.

13. The electronic device of claim 11, wherein the second rotating arm further comprises a rotating portion, wherein the connection portion further comprises a second end located on an inner side of the side wall, and wherein the rotating portion is connected to the second end of the connection portion, the rotating portion rotates relative to the shaft cover, and the rotating portion can rotate around the rotating shaft.

14. The electronic device of claim 13, wherein the connection portion comprises a first connecting piece and a second connecting piece, and there is an included angle between the first connecting piece and the second connecting piece to form an L-shaped structure, wherein one end of the first connecting piece is the second end, and is connected to the rotating portion, wherein the other end of the first connecting piece extends along a direction in which the rotating portion is away from the rotating shaft, and is connected to one end of the second connecting piece, and wherein the other end of the second connecting piece is the first end, and is connected to the slider.

15. The electronic device of claim 14, wherein a width of the first connecting piece is greater than a width of the second connecting piece, wherein the second connecting piece is disposed between two end faces of the first connecting piece in the direction of the rotating shaft, and wherein the second connecting piece, the slider, and the first connecting piece separately form a first groove and a second groove on both ends of the slider.

16. The electronic device of claim 11, wherein the second rotating arm further comprises a protruding portion, and wherein one end of the protruding portion is connected to the first end of the connection portion, the other end of the protruding portion extends for a certain distance in a direction close to the side wall, and the slider and the protruding portion are located in a same plane.

17. The electronic device of claim 16, wherein the second rotating arm comprises two protruding portions, and wherein the two protruding portions are distributed at two ends of the slider in the direction of the rotating shaft.

18. The electronic device of claim 17, wherein the second rotating arm further comprises a connecting piece, wherein one end of the connecting piece is connected to the first end of the connection portion, the other end of the connecting piece extends for a certain distance in a direction close to the side wall, and the connecting piece and the protruding portions are in a same plane, and wherein end faces of the connecting piece in the direction of the rotating shaft are separately connected to the two protruding portions.

19. A rotating shaft mechanism, comprising:
   a shaft cover and first rotating arms disposed on both sides of the shaft cover, wherein the shaft cover comprises a side wall facing one of the first rotating arms; and
   a second rotating arm disposed between the one of the first rotating arms and the shaft cover, wherein the one of the first rotating arms is slidably connected to the second rotating arm, and the second rotating arm is configured to rotate relative to the shaft cover, so that the one of the first rotating arms and the shaft cover form a rotational connection, wherein the second rotating arm comprises:
      a rotating shaft located on an inner side of the side wall, wherein the inner side of the side wall is a side facing away from the second rotating arm;
      a connection portion comprising a first end located between the first rotating arm and the side wall; and
      a slider, wherein one end of the slider is connected to the first end of the connection portion, and the other end extends for a first distance along a direction away from the side wall, and wherein the slider separately has a second distance and a third distance from two end faces of the connection portion in a direction of the rotating shaft,
   wherein the first rotating arm comprises a chute that is slidably connected to the slider, such that the chute overlaps the second rotating arm,
   wherein the chute extends for a fourth distance in a direction close to the rotating shaft,
   wherein when the rotating shaft mechanism is being unfolded, an end of the chute that is close to the rotating shaft extends beyond the first end, to increase an overlapping length between the chute and the second rotating arm, and
   wherein the second rotating arm further comprises a rotating portion, wherein the connection portion further comprises a second end located on an inner side of the side wall, and wherein the rotating portion is connected to the second end of the connection portion, the rotating portion rotates relative to the shaft cover, and the rotating portion can rotate around the rotating shaft.

20. The rotating shaft mechanism of claim 19, wherein the connection portion comprises a first connecting piece and a second connecting piece, and there is an included angle between the first connecting piece and the second connecting piece to form an L-shaped structure, wherein one end of the first connecting piece is the second end, and is connected to the rotating portion, wherein the other end of the first connecting piece extends along a direction in which the rotating portion is away from the rotating shaft, and is connected to one end of the second connecting piece, and wherein the other end of the second connecting piece is the first end, and is connected to the slider.

* * * * *